United States Patent
Wan et al.

(10) Patent No.: US 12,247,133 B2
(45) Date of Patent: Mar. 11, 2025

(54) PHOTOCURABLE COMPOSITION INCLUDING A REACTIVE POLYMER

(71) Applicant: CANON KABUSHIKI KAISHA, Tokyo (JP)

(72) Inventors: Fen Wan, Austin, TX (US); Timothy Brian Stachowiak, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 277 days.

(21) Appl. No.: 17/651,544

(22) Filed: Feb. 17, 2022

(65) Prior Publication Data
US 2023/0257617 A1    Aug. 17, 2023

(51) Int. Cl.
| | | |
|---|---|---|
| *C09D 133/08* | (2006.01) | |
| *C09D 11/00* | (2014.01) | |
| *G03F 7/004* | (2006.01) | |
| *G03F 7/20* | (2006.01) | |

(52) U.S. Cl.
CPC ............ *C09D 133/08* (2013.01); *C09D 11/00* (2013.01); *G03F 7/0045* (2013.01); *G03F 7/2004* (2013.01)

(58) Field of Classification Search
None
See application file for complete search history.

(56) References Cited

U.S. PATENT DOCUMENTS

| | | | | |
|---|---|---|---|---|
| 3,557,045 A * | 1/1971 | Wright et al. | ........ | C08F 263/08 524/508 |
| 4,308,119 A * | 12/1981 | Russell | ................. | C08F 251/02 522/89 |
| 6,099,783 A * | 8/2000 | Scranton | ............. | B29C 35/0888 264/494 |
| 6,352,782 B2 * | 3/2002 | Yeager | .................. | C08L 71/126 525/391 |
| 8,703,892 B2 * | 4/2014 | Kodama | .............. | C09D 133/10 428/64.2 |

(Continued)

FOREIGN PATENT DOCUMENTS

| | | |
|---|---|---|
| JP | 2021076643 A | 5/2021 |
| WO | 2020222973 A1 | 11/2020 |

OTHER PUBLICATIONS

TMPTMA, Chemspider, Royal Society of Chemistry, 2024. (Year: 2024).*
J Therm Anal Calorim (2015) 119:1157-1161.

*Primary Examiner* — Peter A Salamon
(74) *Attorney, Agent, or Firm* — Abel Schillinger, LLP

(57) ABSTRACT

A photocurable composition can comprise a polymerizable material, and a photoinitiator, wherein the polymerizable material can comprise at least one polymerizable monomer and at least one reactive polymer. The reactive polymer can have a carbon content of at least 75% based on the total weight of the reactive polymer; a molecular weight of the at least one reactive polymer can be at least 400 g/mol and not greater than 50,000 g/mol; an amount of the reactive polymer may be at least 5 wt %; and a viscosity of the photocurable composition may be not greater than 100 mPa s. The photocurable composition may have a low linear shrinkage after curing, a high carbon content and high etch resistance and being suitable for AIP or NIL processing.

18 Claims, 3 Drawing Sheets

(56) References Cited

U.S. PATENT DOCUMENTS

| | | | |
|---|---|---|---|
| 8,765,831 B2* | 7/2014 | Minegishi | G03F 7/027 |
| | | | 520/1 |
| 9,376,581 B2* | 6/2016 | Kitagawa | C09D 11/101 |
| 9,663,671 B2* | 5/2017 | Enomoto | B82Y 40/00 |
| 2005/0075462 A1* | 4/2005 | Zarnoch | C08G 65/485 |
| | | | 525/391 |
| 2006/0287439 A1* | 12/2006 | Zarnoch | C08F 290/062 |
| | | | 525/392 |
| 2008/0277826 A1* | 11/2008 | Chou | B82Y 40/00 |
| | | | 264/293 |
| 2010/0087591 A1* | 4/2010 | Zarnoch | C08G 65/485 |
| | | | 526/333 |
| 2017/0275430 A1* | 9/2017 | Kube | C08J 5/249 |
| 2019/0085150 A1* | 3/2019 | Hu | C08K 5/0066 |
| 2020/0296837 A1* | 9/2020 | Aoude | H05K 3/0026 |
| 2021/0070906 A1* | 3/2021 | Li | C08F 220/18 |
| 2021/0309850 A1* | 10/2021 | Liu | B33Y 80/00 |
| 2022/0185914 A1 | 6/2022 | Wan | |

\* cited by examiner

PHOTOCURABLE COMPOSITION INCLUDING A REACTIVE POLYMER

FIELD OF THE DISCLOSURE

The present disclosure relates to a photocurable composition, particularly to a photo-curable composition for inkjet adaptive planarization adapted for forming photo-cured layers having a high carbon content, low thermal shrinkage, and high thermal stability.

BACKGROUND

Inkjet Adaptive Planarization (IAP) is a process which planarizes a surface of a substrate, e.g., a wafer containing an electric circuit, by jetting liquid drops of a photocurable composition on the surface of the substrate, and bringing a flat superstrate in direct contact with the added liquid to form a flat liquid layer. The flat liquid layer is typically solidified under UV light exposure, and after removal of the superstrate a planar polymeric surface is obtained, which can be subjected to subsequent processing steps, for example baking, etching, and/or further deposition steps.

There exists a need for improved IAP materials leading to planar photo-cured layers with a high etch resistance, high thermal stability, and low shrinkage during subsequent processing.

SUMMARY

In one embodiment, a photocurable composition can comprise a polymerizable material and a photoinitiator, wherein the polymerizable material comprises at least one polymerizable monomer and at least one reactive polymer; the reactive polymer can comprise a carbon content of at least 75% based on the total weight of the reactive polymer; a molecular weight of the at least one reactive polymer can be at least 400 g/mol and not greater than 50,000 g/mol; an amount of the reactive polymer can be at least 5 wt % based on the total weight of the polymerizable material; and a viscosity of the photocurable composition may be not greater than 100 mPa·s.

In one aspect of the photocurable composition, the reactive polymer can comprise a structure of formula (1): $R_1$—$X_n$—$R_2$ (1), with X being repeating monomer units of a same type or different types, n being 3 to 300, $R_1$ and $R_2$ including independently or both a vinyl group, an acrylate group, a methacrylate group, or vinylbenzene group. In a certain aspect, X of formula (1) can be —O—Ar—, or —Ar—C=O, or —$CH_2$—$CHR_3$—$CH_2$—, with $R_3$ being benzene, naphthene, anthracene, cyclohexane, isobornyl, or adamantane, and Ar being substituted or unsubstituted benzene, naphthalene, or anthracene.

In another aspect of the photocurable composition, the reactive polymer can comprise a structure of formula (2): $R_1$—$X_n$—Y—$X_m$—$R_2$ (2), with X being repeating monomer units of the same type or different types, n being 3 to 150, m being 3-150, Y being a linking unit, R1 and R2 including independently or both a vinyl group, an acrylate group, a methacrylate group, or vinylbenzene group. In a particular aspect, X of formula (2) can be —O—Ar—, or —Ar—C=O, with Ar being substituted or unsubstituted benzene, naphthalene, or anthracene.

In a further embodiment of the photocurable composition, the reactive polymer can comprise functional groups attached to its repeating monomer units, and a number ratio of the functional groups to the repeating monomer units can range from 1:3 to 1:100.

In another embodiment, the photocurable composition can be adapted that a linear shrinkage of the photocurable composition after photo-curing is not greater than 6 percent.

In a certain aspect, the viscosity of the photocurable composition can be not greater than 35 mPa·s.

In one embodiment, the total carbon of the photocurable composition after curing can be at least 69%.

In another embodiment, the molecular weight of the reactive polymer can be at least 800 g/mol and not greater than 10,000 g/mol.

In one aspect, the amount of the reactive polymer can be at least 5 wt % and not greater than 30 wt % based on the total weight of the polymerizable material.

In a particular aspect, the amount of the polymerizable material can be at least 50 wt % based on the total weight of the photocurable composition.

In another aspect, the at least one polymerizable monomer of the polymerizable material can have a boiling point of at least 250° C.

In a further aspect, the at least one polymerizable monomer can include at least one acrylate monomer. In a particular aspect, the at least one acrylate monomer may include at least one multi-functional acrylate monomer.

In a certain aspect, the photocurable composition is adapted for nanoimprint lithography (NIL) or inkjet adaptive planarization (IAP) processing.

In another aspect of the photocurable composition, the thermal decomposition temperature of the photocurable composition after photo-curing can be at least 300° C.

In one embodiment, a method of forming a photo-cured layer on a substrate can comprise: applying a layer of a photocurable composition on the substrate, wherein the photocurable composition comprises a polymerizable material and a photoinitiator, wherein the polymerizable material comprises at least one polymerizable monomer and at least one reactive polymer; the reactive polymer may comprise a carbon content of at least 75% based on the total weight of the reactive polymer; a molecular weight of the at least one reactive polymer can be at least 400 g/mol and not greater than 50,000 g/mol; an amount of the reactive polymer can be at least 5 wt % based on the total weight of the photocurable composition; and a viscosity of the photocurable composition may be not greater than 100 mPa·s; bringing the photocurable composition into contact with a template or a superstrate; irradiating the photocurable composition with light to form a photo-cured layer; and removing the template or the superstrate from the photo-cured layer.

In one aspect of the method, the linear thermal shrinkage of the layer of the photocurable composition after forming the photo-cured layer can be not greater than 6 percent.

In another embodiment, a method of manufacturing an article can comprise: applying a layer of a photocurable composition on the substrate, wherein the photocurable composition comprises a polymerizable material and a photoinitiator, wherein the polymerizable material comprises at least one polymerizable monomer and at least one reactive polymer; the reactive polymer can comprise a carbon content of at least 75% based on the total weight of the reactive polymer; the molecular weight of the at least one reactive polymer can be at least 400 g/mol and not greater than 50,000 g/mol; the amount of the reactive polymer can be at least 5 wt % based on the total weight of the photocurable composition; and the viscosity of the photocurable composition may be not greater than 100 mPa·s; bringing the photocurable composition into contact with a template or a superstrate; irradiating the photocurable composition with light to form a photo-cured layer; removing the template or the superstrate from the photo-cured layer; forming a pattern on the substrate; processing the substrate on which the pattern has been formed in the forming; and manufacturing an article from the substrate processed in the processing.

BRIEF DESCRIPTION OF THE DRAWINGS

Embodiments are illustrated by way of example and are not limited in the accompanying figure.

Figure 1:
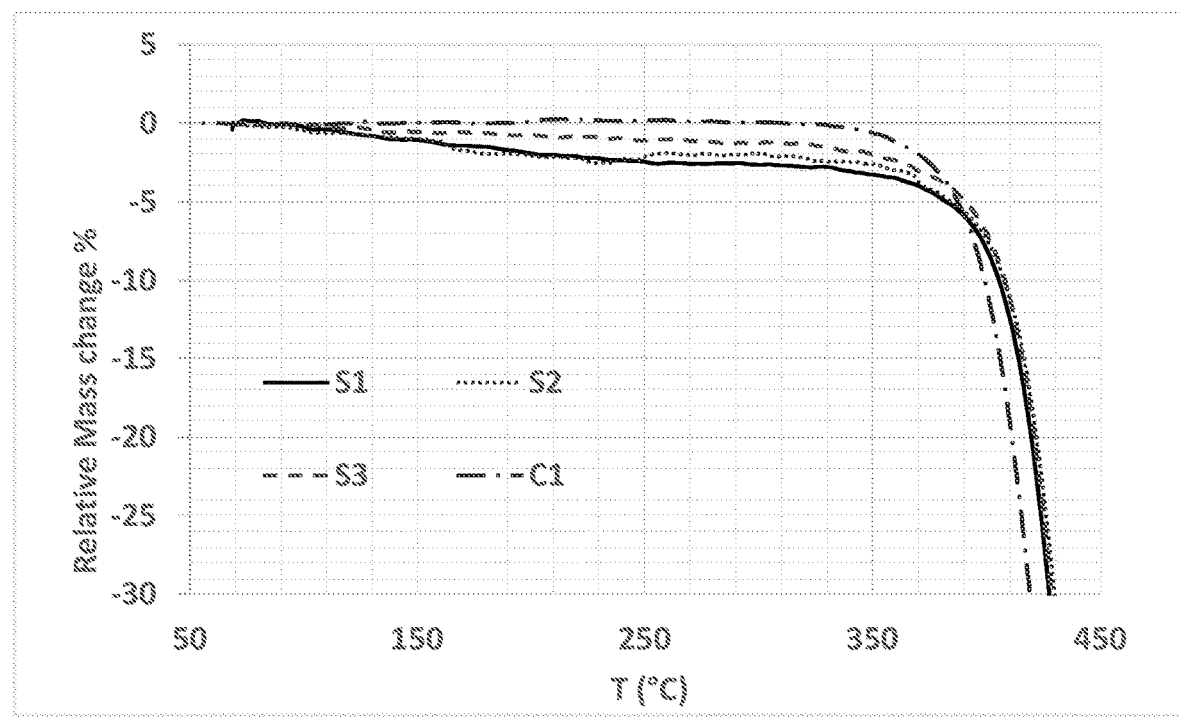
FIG. 1 includes a graph showing dynamic TGA curves of photo-cured samples according to one embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a photocurable composition comprising a polymerizable material and a photoinitiator, wherein the polymerizable material comprises at least one polymerizable monomer and at least one reactive polymer. The reactive polymer can comprise a carbon content of at least 75% based on the total weight of the reactive polymer; a molecular weight of the at least one reactive polymer can be at least 400 g/mol and not greater than 50,000 g/mol; an amount of the reactive polymer may be at least 5 wt % based on the total weight of the polymerizable material; and a viscosity of the photocurable composition can be not greater than 100 mPa·s.

It has been surprisingly observed that photocurable compositions comprising certain combinations of at least one polymerizable monomer and at least one reactive polymer can allow the forming of photo-cured layers having an improved thermal stability and a lower linear shrinkage compared to respective photocurable compositions not including a reactive polymer.

Not being bound to theory, it is assumed that the reactive polymer can participate during the photo-initiated polymerization of the monomers in the forming of a polymeric matrix and thereby reducing shrinkage. The right balance of the type and amount of reactive polymer and the type and amount of polymerizable monomers can facilitate in the forming of highly suitable resist material for NIL or IAP processing, having a low viscosity, high carbon content, high thermal stability, and high etch resistance.

As used herein, the term "reactive polymer" relates to a polymer comprising functional groups which can react with the functional groups of the polymerizable monomers of the polymerizable material.

In one aspect, the reactive polymer can comprise a structure of formula (1): $R_1—X_n—R_2$ (1), with X being repeating monomer units of the same type or of different types, n being 3 to 300, $R_1$ and $R_2$ including independently or both a vinyl group, an acrylate group, a methacrylate group, or a vinylbenzene group. In certain aspects, X can be $—O—Ar—$, or $—Ar—C=O$, or $—CH_2—CHR_3—CH_2—$, with $R_3$ being benzene, naphthene, anthracene, cyclohexane, isobornyl, or adamantane, and Ar being substituted or unsubstituted benzene, naphthalene, or anthracene.

In another aspect, the reactive polymer may comprise a structure of formula (2): $R_1—X_n—Y—X_m—R_2$ (2), with X being repeating monomer units of the same type or of different types, n being 3 to 150, m being 3-150, Y being a linking unit, $R_1$ and $R_2$ including independently or both a vinyl group, an acrylate group, a methacrylate group, or a vinylbenzene group. In certain aspects, X may be $—O—Ar—$, or $—Ar—C=O$, with Ar being substituted or unsubstituted benzene, naphthalene, or anthracene. The linking unit Y can be alkyl, oxy-alkyl, Ar, or $—O—Ar—Ar—O—$, with Ar being substituted or unsubstituted benzene, cyclohexane, naphthene, or anthrazene. In a particular aspect, substituted Ar can include one to three methyl or ethyl groups per benzene ring.

In a certain aspect, the repeating monomer units X of formula (1) or (2) may not include functional groups suitable to react with vinyl or acrylate groups of the monomers of the polymerizable material, and only the functional groups at the end positions of the reactive polymer are adapted for participating in the polymerization during curing. In one aspect, the first end of the reactive polymer may have a functional group and the second end may not include a functional group. In another aspect, both ends (first end and second end) of the reactive polymer can contain a functional group.

In a particular aspect the functional groups of the reactive polymer and the functional groups of the at least one polymerizable monomer can be vinyl groups, acrylate groups, or a methacrylate groups.

In another aspect, the reactive polymer can comprise functional groups attached to the repeating monomer units of the reactive polymer and/or its end positions, and a number ratio of the functional groups to the repeating monomer units of the reactive polymer can range from 1:3 to 1:100, such as from 1:3 to 1:50, or 1:3 to 1:20.

The reactive polymer can be selected by criteria of having a high carbon content, being soluble in at least one polymerizable monomer of the polymerizable material, having a certain molecular weight range, and providing only a minor contribution to a viscosity increase of the photocurable composition.

A high carbon content of the reactive polymer is desired in order to contribute to a high final carbon content of the photo-cured layer formed from the photocurable composition. In one aspect, the carbon content of reactive polymer can be at least 75% based on the total weight of the reactive polymer, such as at least 78%, at least 80%, at least 82%, at least 84%, at least 86%, at least 88%, at least 90%, or at least 92%.

In certain aspects, the molecular weight of the reactive polymer can be at least 400 g/mol, at least 600 g/mol, or at least 800 g/mol, or at least 1,000 g/mol, or at least 2,000 g/mol, or at least 5,000 g/mol. In other aspects, the molecular weight of the reactive polymer may be not greater than 50,000 g/mol, or not greater than 40,000 g/mol, or not greater than 30,000 g/mol, or not greater than 15,000 g/mol, or not greater than 10,000 g/mol, or not greater than 8,000 g/mol, or not greater than 5,000 g/mol, or not greater than 3,000 g/mol. In a particular embodiment, the molecular weight can be at least 1,000 g/mol and not greater than 10,000 g/mol.

In a further aspect, the amount of the reactive polymer can be at least 5 wt % based on the total weight of the polymerizable material, such as at least 10 wt %, or at least 15 wt %, or at least 20 wt %. In another aspect, the amount of the reactive polymer may be not greater than 40 wt % based on the total weight of the polymerizable material, or not greater than 30 wt %, or not greater than 25 wt %, or not greater than 22 wt %. In a particular aspect the amount of the reactive polymer can be at least 10 wt % and not greater than 30 wt % based on the total weight of the polymerizable material.

The photocurable compositions can be designed of having a low viscosity before curing. In one embodiment, the viscosity of the curable composition can be not greater than 100 mPa·s, or not greater than 80 mPa·s, or not greater than 50 mPa·s, or not greater than 40 mPa·s, or not greater than 35 mPa·s, or not greater than 30 mPa·s, or not greater than 25 mPa·s, or not greater than 20 mPa·s, or not greater than 15 mPa·s. In other certain embodiments, the viscosity may be at least 5 mPa·s, such as at least 10 mPa·s, or at least 15 mPa·s. In a particularly preferred aspect, the photocurable composition can have a viscosity from 20 mPa·s to not greater than 60 mPa·s. As used herein, all viscosity values relate to viscosities measured at a temperature of 23° C. with the Brookfield method using a Brookfield Viscometer.

The at least one polymerizable monomer of the polymerizable material can include mono-functional monomers, multi-functional monomers, or a combination thereof. In a particular aspect the at least one polymerizable monomer can include at least one multi-functional acrylate monomer, or at least one multi-functional vinyl monomer, or a combination of a multi-functional acrylate monomer and a multi-functional vinyl monomer.

Non-limiting examples of multi-functional acrylate monomers can be bisphenol A dimethacrylate, m-xylylene diacrylate, neopentyl glycol diacrylate, trimethylolpropane triacrylate, tetramethylolmethane tetraacrylate, or any combination thereof.

In a further aspect, the polymerizable monomer can have a boiling point of at least 250° C., or at least 260° C., or at least 280° C.

In another certain aspect, the multi-functional vinyl monomer can be divinylbenzene.

In a further particular aspect, the polymerizable material can include at least one mono-functional acrylate monomer and at least one multi-functional acrylate monomer. As used herein the term acrylate monomer relates to both unsubstituted and alkyl-substituted acrylates, for example, methacrylate.

In another aspect, the amount of the multi-functional monomer can be at least 10 wt %, or at least 15 wt %, or at least 20 wt %, or at least 30 wt %, or at least 50 wt %, or at least 80 wt % based on the total weight of the polymerizable material. In another aspect, the amount of the multi-functional monomer may be not greater than 95 wt % of the polymerizable material, or not greater than 90 wt % based, or not greater than 70 wt %, or not greater than 50 wt %, or not greater than 30 wt % based on the total weight of the polymerizable material.

In yet a further aspect, a weight % ratio of the mono-functional monomer to the multi-functional monomer can be from 1:5 to 5:1, such as from 1:3 to 3:1, or from 1:1 to 3:1.

The amount of polymerizable material in the photocurable composition can be at least 30 wt % based on the total weight of the photocurable composition, such as at least 40 wt %, at least 50 wt %, or at least 60 wt %, or at least 70 wt %, or at least 80 wt %, or at least 90 wt %, or at least 95 wt %. In another aspect, the amount of polymerizable material may be not greater than 98 wt %, such as not greater than 95 wt %, or not greater than 90 wt %, or not greater than 80 wt %, or not greater than 60 wt %, or not greater than 50 wt %, or not greater than 30 wt %. The amount of the polymerizable material can be a value between any of the minimum and maximum values noted above. In a particular aspect, the amount of the polymerizable material can be at least 50 wt % and not greater than 98 wt %.

The photocurable composition of the present disclosure can be adapted that a photo-cured layer formed from the photocurable composition may have a high thermal stability. In one aspect, an onset temperature for the thermal degradation of the of the photo-cured layer may be greater than 250° C., or greater than 300° C., or greater than 350° C., or greater than 375° C., or greater than 400° C. As used herein, the onset thermal degradation temperature is also called "initial thermal degradation temperature" or "thermal degradation temperature," and relates to the temperature in the TGA curve wherein a deflection of the curve from the almost linear plateau is first observed, shortly before the steep degradation decline of the sample.

In one embodiment, the photocurable composition of the present disclosure can be essentially free of a solvent. As used herein, if not indicated otherwise, the term solvent relates to a compound which can dissolve or disperse the polymerizable monomers but does not itself polymerize during the photo-curing of the photocurable composition. The term "essentially free of a solvent" means herein an amount of solvent being not greater than 5 wt % based on the total weight of the photocurable composition. In a certain particular aspect, the amount of the solvent can be not greater than 3 wt %, not greater than 2 wt %, not greater than 1 wt % based on the total weight or the photocurable composition, or the photocurable composition can be free of a solvent, except for unavoidable impurities.

In another particular aspect, the photocurable composition can include a solvent in an amount of at least 5 wt % based on the total weight of the photocurable composition, or at least 8 wt %, at least 10 wt %, at least 15 wt %, or at least 20 wt %, or at least 30 wt %, or at least 50 wt %, or at least 70 wt %, or at least 80 wt %, or at least 90 wt %. In another aspect the amount of solvent may be not greater than 95 wt %, or not greater than 80 wt %, or not greater than 50 wt %, or not greater than 40 wt %, or not greater than 30 wt %, or not greater than 20 wt %, or not greater than 15 wt % based on the total weight of the photocurable composition.

In a certain embodiment, the linear shrinkage of the photocurable composition can be not greater than 6%, such as not greater than 5.5%, not greater than 5.0%, not greater than 4.5%, not greater than 4.0%, not greater than 3.5%, or not greater than 3.0%.

In order to initiate the photo-curing of the composition if exposed to light, one or more photoinitiators can be included in the photocurable composition. In a certain aspect, the curing can be also conducted by a combination of light and heat curing.

The photocurable composition can further contain one or more optional additives. Non-limiting examples of optional additives can be stabilizers, dispersants, solvents, surfactants, inhibitors or any combination thereof.

The photocurable composition of the present disclosure can be adapted for use in inkjet adaptive planarization (IAP) or in nanoimprint lithography (NIL).

In one embodiment, the photocurable composition can be applied on a substrate to form a photo-cured layer. As used herein, the combination of substrate and photo-cured layer overlying the substrate is called a laminate.

The inclusion of the at least one reactive polymer of the polymerizable material can contribute to a high carbon content of the photocurable composition and in the formed photo-cured layer. In one embodiment, the photocurable composition can be adapted that a carbon content after curing the composition may be at least 69%, or at least 70%, or at least 71%, at least 72%, at least 73%, at least 74%, or at least 75%.

The present disclosure is further directed to a method of forming a photo-cured layer. The method can comprise applying a layer of the photocurable composition described above over a substrate, bringing the photocurable composition into contact with a template or superstrate; irradiating the photocurable composition with light to form a photo-cured layer; and removing the template or the superstrate from the photo-cured layer.

The substrate and the solidified layer may be subjected to additional processing, for example, an etching process, to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

Photocurable Compositions

Photocurable compositions were prepared including the following reactive polymers: a polyphenylene ether (PPE) based polymer having the structure shown in Table 1 (NORYL SA9000 from Sabic); two polyphenylene ether (PPE) based polymers, OPE-2St-1200 and OPE-St-2200 from Mitsubishi Gas Chemical Company, which differed to each other by the molecular weights, but had the same structure (see Table 1).

All photocurable compositions contained as polymerizable monomer m-xylylene diacrylate (mXDA), having a carbon content of 68%, and further 2 wt % of photoinitiator Omnirad 907 and 1 wt % of surfactant Capstone™ FS-3100. A summary of the tested reactive polymers is shown in Table 1.

TABLE 1

| | | Structure | Molecular Weight [g/mol] | Carbon Content [wt %] |
|---|---|---|---|---|
| 1 | SA9000 | [structure diagram] | 2300 | 80 |
| 2 | OPE-2St-1200 | [structure diagram] | 1200 | 80 |

TABLE 1-continued

| | Structure | Molecular Weight [g/mol] | Carbon Content [wt %] |
|---|---|---|---|
| 3 OPE-2St-2200 | same structure as OPE-2St-1200, only different molecular weight | 2200 | 80 |

A first series of photocurable compositions was prepared wherein the amount of SA9000 was varied, see summary in Table 2.

TABLE 2

| Ingredient | S1 | S2 | S3 | S4 | C1 |
|---|---|---|---|---|---|
| SA9000 | 10 | 15 | 20 | 30 | |
| MXDA | 90 | 85 | 80 | 70 | 100 |
| Photoinitiator | 2 | 2 | 2 | 2 | 2 |
| Surfactant | 1 | 1 | 1 | 1 | 1 |
| Carbon-content [wt %] | 69.46 | 70.05 | 70.63 | 71.80 | 68.29 |
| Viscosity [mPa · s] | 40 | 86 | 204 | 1635 | 12 |
| Initial Degradation Temperature T(X) | 340 | 351 | 357 | 360 | 327 |

A further series of photocurable samples was prepared by including as reactive polymer OPE-2St-1200 and OPE-2St-2200, each in two different amounts, see summary in Table 3.

TABLE 3

| Ingredient | S5 | S6 | S7 | S8 |
|---|---|---|---|---|
| OPE-2St-1200 | 10 | 20 | | |
| OPE-2St-2200 | | | 8.9 | 17.8 |
| MXDA | 90 | 80 | 91.1 | 82.2 |
| Photoinitiator | 2 | 2 | 2 | 2 |
| Surfactant | 1 | 1 | 1 | 1 |
| Carbon-content [wt %] | 69.46 | 70.63 | 69.33 | 70.37 |
| Viscosity [mPa · s] | 26 | 33 | 74 | |
| Initial Degradation Temperature T(X) | 338 | 345 | 339 | 345 |

Viscosities

The viscosity data of Tables 2 and 3 show that with increasing amount of reactive polymer the viscosity increases.

It can be further seen from the data of Table 3 that the viscosity increases with increasing molecular weight of the reactive PKK polymer. The lower molecular weight PKK (OPE-2St-1200) was much better soluble in the MXDA monomer than the higher molecular weight PKK (OPE-2St-2000). The results show that for the use of reactive polymers having a high molecular weight and/or high concentration, the use of a solvent may be recommendable.

The viscosities were measured at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

Thermal Stability

Photo-cured layers were prepared from the photocurable compositions summarized in Tables 2 and 3 by applying 300 micron thick layers of photocurable composition on a glass slide and photo-curing the resist layers. Samples S1-S4 (containing SA9000) were cured by applying UV light with a maximum wavelength at 365 nm at a light intensity of 14 mW/cm$^2$ for 342 seconds (corresponding to a radiation energy of 4.8 J/cm$^2$), while samples S5-S8 were cured by applying a light intensity of 14 mW/cm$^2$ for 714 seconds (radiation energy of 10 J/cm$^2$).

The photo-cured layers were analyzed via thermographical analysis (TGA). The TGA was conducted using a LIN-SEIS STA PT1000 instrument (Linseis Messgeraete GmbH, Germany). All measurements were conducted under nitrogen at a rate of 5 liter per hour.

For dynamic TGA measurements, the samples (about 25 mg per test) were heated at a rate of 20° C./minute and the loss of weight was continually recorded.

If isothermal TGA was conducted, the setup was the same as for dynamic TGA, except that the temperature was raised to 350° C. and maintained stable at this temperature for at least 30 minutes or longer while recording the weight loss.

FIG. 1 shows the dynamic TGA curves of photo-cured samples S1, S2, and S3, in comparison to C1. It can be seen that the inclusion of reactive polymer SA9000 increased the initial thermal degradation of the cured materials, even by using an amount of only 10 wt % SA9000. No further increase in the thermal stability could be observed between materials formed from compositions including 20 wt % SA9000 (S3) and 30 wt % SA9000 (S4) (S4 not shown). Not being bound to theory, the reason for the similar results between 20 wt % and 30 wt % may be the high viscosity of the photocurable composition at 30 wt %, which may lower the reactivity. The exact values of the initial thermal degradation temperatures are also listed in Tables 2.

As used herein, the term "thermal degradation temperature" relates to the initial degradation temperature T(X), which is the temperature of the TGA curve wherein a deflection of the curve from the almost linear plateau shape is first observed, shortly before the steep decline of the mass of the sample, i.e., degradation.

Figure 2:
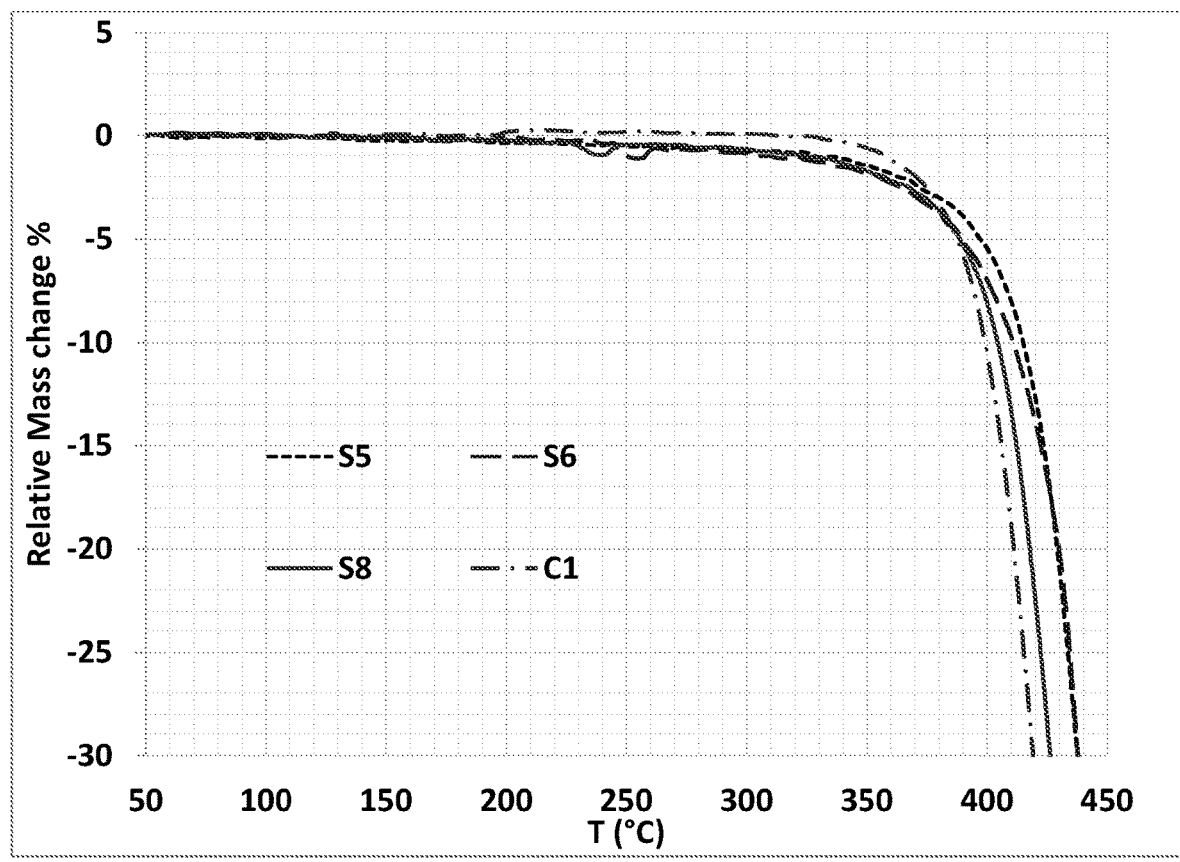
FIG. 2 includes a graph showing dynamic TGA curves of photo-cured samples according to one embodiment.

FIG. 2 illustrates dynamic TGA curves of photo-cured samples S5, S6, and S8. The exact initial degradation temperatures are further listed in Table 3. All samples show an increased initial thermal degradation temperature compared to sample C1, which did not contain a reactive polymer. No major differences could be observed between materials formed with the lower and the higher molecular weight reactive polymer (OPE-2200 and OPE-1200).

Figure 3:
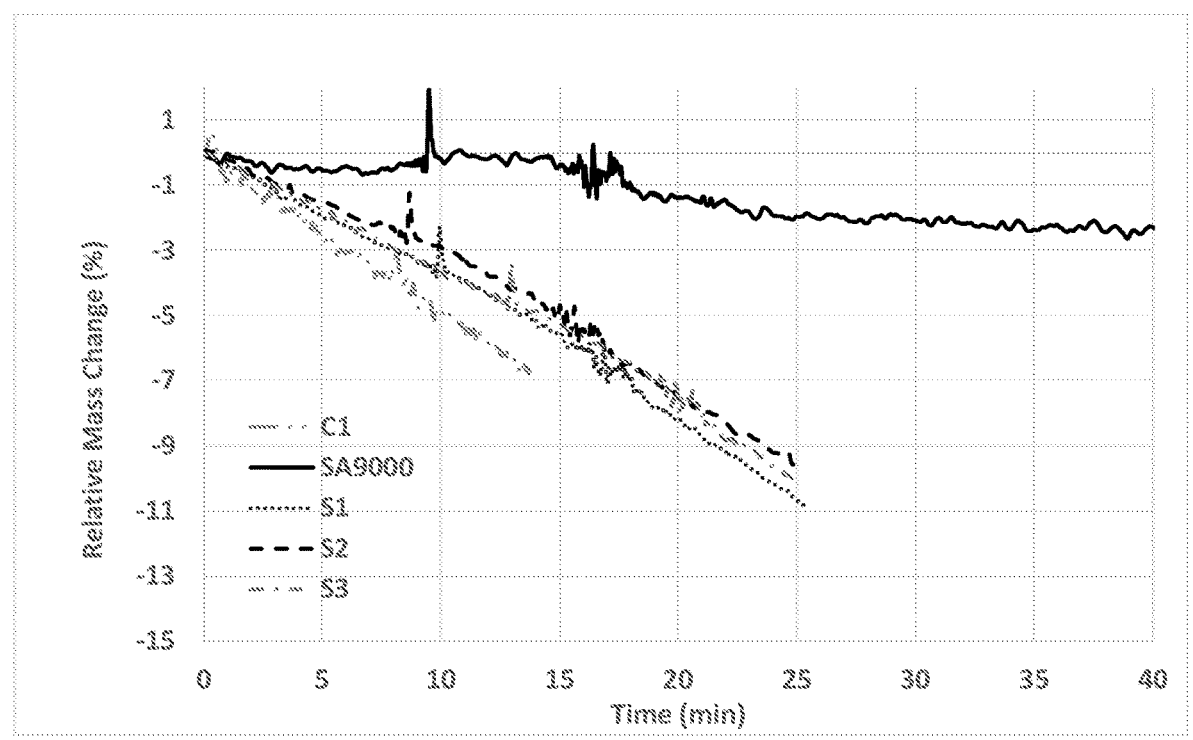
FIG. 3 includes a graph showing isothermal TGA curves of photo-cured samples according to one embodiment.

The isothermal TGA measurements at 350° C. confirm the dynamic TGA measurements. As illustrated in FIG. 3, the photo-cured samples S1, S2, and S3 had a similar degradation speed of about 0.4%/min, while comparative sample C1 (not containing SA9000) had a material loss of 0.5%/min. A curve for SA9000 alone showed that it does not degrade at 350° C., even after 40 minutes.

Subjecting the photo-cured samples S1 to S4 to 2 minutes baking at a hot plate having a temperature of 350° C. under nitrogen showed a weight loss of about 0.8% or less, which is acceptable for IAP processing.

Subjecting samples S5 to S8 to the same baking procedure, i.e., 2 minutes baking at 350° C. under nitrogen, caused a weight loss of about 1.5%, which is also an acceptable value for IPA processing.

Linear Shrinkage

Shrinkage measurements were performed with an Anton Paar MCR-301 rheometer coupled to an UV curing system and heater. For the testing, a drop of 7 μl of the resist composition was added onto a plate and a temperature control hood was released to insulate the drop and the measuring unit. The amount of resist was designed to obtain a thickness (hereinafter also called height) of the resist layer of slightly higher than 0.1 mm. By pre-setting the target height to 0.1 mm, the measuring unit moved down to the set value, causing extra amount of resist flowing off the plate. This ensured that the exact height of the liquid resist was 0.1 mm before curing. Thereafter, the resist was cured with a UV power of 50 mW/cm² at 365 nm for 25 minutes. After curing of the resist, the height was measured again and the linear shrinkage calculated according to the following equation: $SL=(L_R-L_{CR}/L_R)\times100\%$, wherein LR is the thickness of the photocurable composition layer before curing and $L_{CR}$ is the thickness of the cured photocurable composition layer.

A summary of the measured linear shrinkages is shown in Table 4. It can be seen that both types of reactive polymers reduced the linear shrinkage with increasing amounts. An amount of 10 wt % of the reactive polymers reduced the linear shrinkage by about 0.5 to 1%, which was further increased to about 1.5 to 2% shrinkage reduction at an amount of 20 wt % to 30 wt %.

TABLE 4

| Sample | Reactive Polymer | Amount reactive Polymer [wt %] | Linear Shrinkage [%] |
|---|---|---|---|
| C1 | — | — | 6.05 |
| S1 | SA9000 | 10 | 5.65 |
| S2 | SA9000 | 15 | 5.05 |
| S3 | SA9000 | 20 | 4.60 |
| S4 | SA9000 | 30 | 4.05 |
| S5 | OPE-2St-1200 | 10 | 5.25 |
| S6 | OPE-2St-1200 | 20 | 4.80 |
| S7 | OPE-2St-2200 | 17.80 | 4.70 |

Etch Resistance

Photo-cured films for testing the etch resistance were made by dropping 0.5 μl of resist composition on a Si wafer, placing a rigid blank fused silica mold on top of the drop and allowing the liquid to spread for about 5 minutes between the mold and the substrate to obtain a fully filled liquid thin layer. The liquid layer was cured through the mold by using a OAI UV lamp with an intensity of 17 mW/cm². After the curing, the mold was separated from the cured film. The thickness of the cured films was about 700 nm.

For measuring the etch resistance, dry etching under oxygen/argon atmosphere was conducted using a Trion Oracle 3-Chamber Cluster System as etch tool. The following etch conditions were applied: $O_2$: 2 sccm; Argon: 10 sccm; RF power: 45 Watt; pressure: 10 mTorr; etch time: 120 seconds; chuck temperature: 7° C., helium backside press: 5 Torr.

Table 5 shows the measured etch rate (nm/minute) for photo-cured sample S5 (made with 10 wt % OPE-St-1200), S6 (made with 20 wt % OPE-St-1200), and comparative sample C1 (not including a reactive polymer in the photocurable composition, containing only MXDA as polymerizable monomer). It can be seen that samples S5 and S6 etched significantly slower that sample C1. Photo-cured sample S6, made with 20 wt % OPE 1200 had an about 26% slower etch rate than comparative sample C1.

TABLE 5

| Sample | Etch rate [nm/min] |
|---|---|
| S5 | 36 |
| S6 | 33 |
| C1 | 42 |

Carbon Content

Tables 2 and 3 show for the listed photocurable compositions the calculated carbon content contained in the photocured layers after curing. For the carbon content calculations, it was assumed that the polymerizable material (reactive polymer and polymerizable monomers) amounts to 100% of the layer material, and the carbon content was calculated based on the calculated weight of all ingredients per mol, wherein "%" stands for the weight percent of the carbon of the layer material. The calculated carbon content should be very close to the actual carbon content, since there is no material loss, such as forming a gas or water during the curing.

The carbon content of the reactive polymer (shown in Table 1) was calculated based on the molecular weight of the monomer units of the polymer and relates to weight % per total weight of the reactive polymer.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A photocurable composition comprising a polymerizable material and a photoinitiator, wherein
the polymerizable material comprises at least one polymerizable monomer and at least one reactive polymer;
the reactive polymer comprises a carbon content of at least 75% based on the total weight of the reactive polymer;
a molecular weight of the at least one reactive polymer is at least 400 g/mol and not greater than 50,000 g/mol;
an amount of the reactive polymer is at least 5 wt % based on the total weight of the polymerizable material; and
a viscosity of the photocurable composition is not greater than 100 mPa·s, wherein
an amount of the polymerizable material is at least 50 wt % based on the total weight of the photocurable composition;
the polymerizable monomer comprises a multi-functional acrylate monomer in an amount of at least 50 wt % based on the total weight of the polymerizable material and further at least one mono-functional acrylate monomer; and a total carbon content of the photocurable composition after curing is at least 69%.

2. The photocurable composition of claim 1, wherein the reactive polymer comprises a structure of formula (1): $R_1—X_n—R_2$ (1), with X being repeating monomer units of a same type or different types, n being 3 to 300, R1 and R2 including independently or both a vinyl group, an acrylate group, a methacrylate group, or a vinylbenzene group.

3. The photocurable composition of claim 2, wherein X is —O—Ar—, or —Ar—C=O, or —$CH_2$—$CHR_3$—$CH_2$—, with $R_3$ being benzene, naphthene, anthracene, cyclohexane, isobornyl, or adamantane, and Ar being substituted or unsubstituted benzene, naphthalene, or anthracene.

4. The photocurable composition of claim 1, wherein the reactive polymer comprises a structure of formula (2): $R_1—X_n—Y—X_m—R_2$ (2), with X being repeating monomer units of same type or different types, n being 3 to 150, m being 3-150, Y being a linking unit, R1 and R2 including independently or both a vinyl group, an acrylate group, a methacrylate group, or a vinylbenzene group.

5. The photocurable composition of claim 4, wherein X is —O—Ar—, or —Ar—C=O, with Ar being substituted or unsubstituted benzene, naphthalene, or anthracene.

6. The photocurable composition of claim 1, wherein the reactive polymer comprises functional groups attached to repeating monomer units of the reactive polymer, and a number ratio of the functional groups to the repeating monomer units ranges from 1:3 to 1:100.

7. The photocurable composition of claim 1, wherein the photocurable composition is adapted that a linear shrinkage of the photocurable composition after photo-curing is not greater than 6 percent.

8. The photocurable composition of claim 1, wherein the viscosity of the photocurable composition is not greater than 35 mPa·s.

9. The photocurable composition of claim 1, wherein the molecular weight of the reactive polymer is at least 800 g/mol and not greater than 10,000 g/mol.

10. The photocurable composition of claim 1, wherein the amount of the reactive polymer is at least 5 wt % and not greater than 30 wt % based on the total weight of the polymerizable material.

11. The photocurable composition of claim 1, wherein an amount of the polymerizable material is at least 80 wt % based on the total weight of the photocurable composition.

12. The photocurable composition of claim 1, wherein the at least one multi-functional monomer has a boiling point of at least 250° C., and an amount of the multi-functional monomer is at least 80 wt % based on the total weight of the polymerizable material.

13. The photocurable composition of claim 1, wherein a weight percent ratio of the at least one mono-functional acrylate monomer to the at least one multi-functional acrylate monomer ranges from 1:3 to 1:5.

14. The photocurable composition of claim 1, wherein the photocurable composition is adapted for nanoimprint lithography (NIL) or inkjet adaptive planarization (IAP) processing.

15. The photocurable composition of claim 1, wherein a thermal degradation temperature of the photocurable composition after photo-curing is at least 300° C.

16. A method of forming a photo-cured layer on a substrate, comprising:

applying a layer of a photocurable composition on the substrate, wherein the photocurable composition comprises a polymerizable material and a photoinitiator, wherein the polymerizable material comprises at least one polymerizable monomer and at least one reactive polymer; the reactive polymer comprises a carbon content of at least 75% based on the total weight of the reactive polymer; a molecular weight of the at least one reactive polymer is at least 400 g/mol and not greater than 50,000 g/mol; an amount of the reactive polymer is at least 5 wt % based on the total weight of the photocurable composition; a viscosity of the photocurable composition is not greater than 100 mPa·s; an amount of the polymerizable material is at least 50 wt % based on the total weight of the photocurable composition; and the polymerizable monomer comprises a multi-functional acrylate monomer in an amount of at least 50 wt % based on the total weight of the polymerizable material and further at least one mono-functional acrylate monomer, and a total carbon content of the photocurable composition after curing is at least 69%;

bringing the photocurable composition into contact with a template or a superstrate;

irradiating the photocurable composition with light to form a photo-cured layer; and removing the template or the superstrate from the photo-cured layer.

17. The method of claim 16, wherein a linear thermal shrinkage of the layer of the photocurable composition after forming the photo-cured layer is not greater than 6 percent.

18. A method of manufacturing an article, comprising:

applying a layer of a photocurable composition on the substrate, wherein the photocurable composition comprises a polymerizable material and a photoinitiator, wherein the polymerizable material comprises at least one polymerizable monomer and at least one reactive polymer; the reactive polymer comprises a carbon content of at least 75% based on the total weight of the reactive polymer; a molecular weight of the at least one reactive polymer is at least 400 g/mol and not greater than 50,000 g/mol; an amount of the reactive polymer is at least 5 wt % based on the total weight of the photocurable composition; a viscosity of the photocurable composition is not greater than 100 mPa·s; an amount of the polymerizable material is at least 50 wt % based on the total weight of the photocurable composition; and the polymerizable monomer comprises a multi-functional acrylate monomer in an amount of at least 50 wt % based on the total weight of the polymerizable material and further at least one mono-functional acrylate monomer, and a total carbon content of the photocurable composition after curing is at least 69%;

bringing the photocurable composition into contact with a template or a superstrate;

irradiating the photocurable composition with light to form a photo-cured layer;

removing the template or the superstrate from the photo-cured layer;

forming a pattern on the substrate;

processing the substrate on which the pattern has been formed in the forming; and manufacturing an article from the substrate processed in the processing.

* * * * *